US009151816B2

(12) United States Patent
Fautz et al.

(10) Patent No.: US 9,151,816 B2
(45) Date of Patent: Oct. 6, 2015

(54) METHOD AND MAGNETIC RESONANCE SYSTEM FOR ACQUIRING MAGNETIC RESONANCE DATA IN A PREDETERMINED REGION OF AN EXAMINATION SUBJECT

(75) Inventors: Hans-Peter Fautz, Forchheim (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 678 days.

(21) Appl. No.: 13/564,137

(22) Filed: Aug. 1, 2012

(65) Prior Publication Data
US 2013/0033263 A1    Feb. 7, 2013

(30) Foreign Application Priority Data
Aug. 1, 2011 (DE) .......................... 10 2011 080 215

(51) Int. Cl.
*G01R 33/565* (2006.01)
*G01R 33/48* (2006.01)
*G01R 33/483* (2006.01)

(52) U.S. Cl.
CPC ...... *G01R 33/56545* (2013.01); *G01R 33/4822* (2013.01); *G01R 33/4833* (2013.01)

(58) Field of Classification Search
CPC ........... G01R 33/4822; G01R 33/4833; G01R 33/56545
See application file for complete search history.

(56) References Cited

U.S. PATENT DOCUMENTS

| 4,698,592 | A | 10/1987 | Feinberg | |
|---|---|---|---|---|
| 5,049,820 | A * | 9/1991 | Briand et al. | 324/309 |
| 5,345,176 | A * | 9/1994 | LeRoux et al. | 324/309 |
| 5,749,834 | A * | 5/1998 | Hushek | 600/410 |
| 6,946,839 | B2 * | 9/2005 | Porter | 324/309 |
| 7,777,488 | B2 * | 8/2010 | Gore et al. | 324/309 |
| 8,334,691 | B2 * | 12/2012 | Lee et al. | 324/306 |
| 8,604,788 | B2 * | 12/2013 | Li et al. | 324/309 |
| 9,014,783 | B2 * | 4/2015 | Rehwald et al. | 600/413 |
| 2011/0017612 | A1 | 1/2011 | Dijksman et al. | |
| 2012/0025826 | A1 | 2/2012 | Zhou et al. | |

OTHER PUBLICATIONS

"Strategies for Inner Volume 3D Fast Spin Echo MRI," Mitsouras et al., Proc. Intl. Soc. Mag. Reson. Med., vol. 11 (2003), p. 968.

* cited by examiner

*Primary Examiner* — Dixomara Vargas
(74) *Attorney, Agent, or Firm* — Schiff Hardin LLP (57) ABSTRACT

In a method and a magnetic resonance system to acquire MR data in a predetermined region within an examination subject, a first three-dimensional volume segment is selectively excited with an RF excitation pulse, this first volume segment including the predetermined region and having a first thickness along a first thickness direction. A selective refocusing pulse is activated in order to selectively refocus a second volume segment. The second volume segment likewise includes the predetermined region and has a second thickness along a second thickness direction orthogonal to the first thickness direction. The following sub-steps are implemented repeatedly in succession: a non-selective refocusing pulse is activated. Two phase coding gradients and an additional magnetic field gradient are activated for spatial coding, and the MR data are read out while the additional magnetic field gradient is activated.

11 Claims, 5 Drawing Sheets

METHOD AND MAGNETIC RESONANCE SYSTEM FOR ACQUIRING MAGNETIC RESONANCE DATA IN A PREDETERMINED REGION OF AN EXAMINATION SUBJECT

BACKGROUND OF THE INVENTION

1. Field of the Invention

The present invention concerns a method and a correspondingly designed magnetic resonance (MR) system for acquiring MR data in a predetermined region, in particular in a (three-dimensional) cuboid of an examination subject.

2. Description of the Prior Art

U.S. Pat. No. 4,698,592 describes a method to acquire MR images based on a spectral chemical shift in an internal volume of a subject. An RF excitation pulse is radiated during a switched (activated) $G_y$ gradient, and subsequently a refocusing pulse is radiated during a switched $G_z$ gradient.

According to the prior art, in the acquisition of MR data of a predetermined region (under the circumstances that the subject is not completely covered in the phase coding direction), aliasing artifacts occur because signals from adjacent regions are not correctly associated with their location due to aliasing.

SUMMARY OF THE INVENTION

An object of the invention is to provide a method and system for acquiring MR data such that the aliasing artifacts are at least lesser in comparison to conventional techniques.

In accordance with the present invention a method to acquire MR data in a predetermined region (in particular in a cuboid) within an examination subject by means of a magnetic resonance system includes the following steps:

A first three-dimensional volume segment is selectively excited with an RF excitation pulse. The first volume segment includes the predetermined region and has a first thickness along a first predetermined thickness direction.

A selective refocusing pulse is subsequently switched with which a second volume segment is selectively refocused. The second volume segment also includes the predetermined region and has a second thickness along a second thickness direction. This second thickness direction is situated orthogonally to the first thickness direction.

After this refocusing, a step composed of the follow partial steps is executed repeatedly in succession in order to acquire the MR data in the predetermined region: switch (activate) a non-selective refocusing pulse, and switch (activate) two phase coding gradients and an additional magnetic field gradient for spatial coding (the two phase coding gradients and the additional magnetic field gradient of the spatial coding serve for this), with the MR data being read out while the additional magnetic field gradient is switched.

According to the invention, a first slice (the first volume segment) with the first thickness is excited essentially with the RF excitation pulse, and following this a second slice (the second volume segment) with the second thickness—the second slice being orthogonal to said first slice—is excited with the RF refocusing pulse. The predetermined region is now situated within an intersection set of these two slices, i.e, it forms a defined part of this intersection set. Because the first volume segment is not selectively refocused again by the refocusing pulse (as is typical according to the prior art), but rather the second volume segment is selectively refocused, the predetermined region in which the MR data are to be acquired is advantageously limited in the second thickness direction. This causes aliasing artifacts from this direction to occur at least to a lesser degree, or to be avoided entirely, since the spins in the neighboring regions in this direction were not refocused, and therefore provide no signal contribution.

To acquire the MR data, the two phase coding gradients and the additional magnetic field gradients are respectively orthogonal to one another in pairs. One of the phase coding gradients is directed along the first thickness direction.

Since the switching of non-selective refocusing pulses takes a smaller amount of time (for example 0.5 to 1 ms) than the switching of selective refocusing pulses (for example 2 to 3 ms), and since the second phase coding gradient is switched simultaneously with the first phase coding gradient, the acquisition of MR data according to the invention with two phase coding gradients and additional magnetic field gradient advantageously offers a very fast type of MR data acquisition in comparison to a method with selective refocusing pulses for MR data acquisition.

According to an embodiment of the invention, a first magnetic field gradient is switched during the switching of the RF excitation pulse for selective excitation of the first volume segment, and a second magnetic field gradient is switched during the switching of the selective refocusing pulse. These two magnetic field gradients are orthogonal to one another.

According to a further embodiment of the invention, the predetermined region corresponds to a cuboid that has the first thickness along the first thickness direction and the second thickness along the second thickness direction.

Expressed differently, the cuboid corresponds to the intersection set from the first volume segment and the second volume segment, at least along the first thickness direction and along the second thickness direction.

The non-selective refocusing pulses used to acquire the MR data can have various tilt angles, commonly called flip angles. The use of different flip angles enables a predetermined average signal strength of the MR signal (or a predetermined relative signal attenuation) to be achieved upon readout of the MR data after switching the respective refocusing pulse, if the flip angles of the refocusing pulses are selected depending on a material (substance) with which the predetermined region is primarily filled (occupied).

Given use of constant flip angles (of 180°, for example) in the non-selective refocusing pulses, the average signal strength decreases exponentially upon readout of the MR data. As is explained in detail below, by a suitable selection of the flip angles of the refocusing pulses this decrease of the signal strength can be maintained or even reversed over a long period of time, thus over numerous refocusing pulses. The use of different flip angles for the non-selective refocusing pulses thus allows more k-space lines can be acquired per RF excitation than given constant flip angles.

According to the invention, one or more spoiler gradients or rephasing gradients can also be switched before and after the selective refocusing pulse. These one or more spoiler gradients include a spoiler gradient that is directed along the second thickness direction. However, it is also possible for the spoiler gradients to be a spoiler gradient which is aligned orthogonal to the second thickness direction.

The switching of spoiler gradients serves to destroy any "old" (persisting) magnetization.

According to a further embodiment of the invention, the acquisition of the MR data of a k-space segment (composed of multiple k-space lines, for example) includes the following steps.

In a first step, the RF excitation pulse flips the magnetization by +90° and first MR data of the k-space segment are acquired according to the invention (via switching of the selective refocusing pulse and via switching of the non-selective refocusing pulses).

In a second step, the RF excitation pulse flips the magnetization by −90° and second MR data of the same k-space segment are acquired according to the invention.

The acquired first and second MR data are subsequently averaged, wherein these averaged MR data yield the MR data of the k-space segment that are to be acquired.

Since the magnetization of the FID signals ("Free Induction Decay") of the non-selective refocusing pulses is flipped once by +90° and once by −90° during the excitation, upon acquisition of the first MR data the FID signals behave in precisely the opposite manner as in the acquisition of the second MR data, such that the mean of these FID signals is obtained by calculating the mean value in the determination of the final MR data of the k-space segment, and artifacts can thereby be avoided.

The present invention also encompasses a magnetic resonance system to acquire MR data in a predetermined range within an examination subject. The magnetic resonance system includes a basic field magnet, a gradient field system, one or more RF antennas, and a control device to control the gradient field system and the RF antenna(s), to receive the measurement signals acquired by the RF antenna(s), and to evaluate the measurement signals and to create the MR image data sets. The magnetic resonance system is configured to selectively excite a first three-dimensional volume segment that includes the predetermined region with an RF excitation pulse. This first volume segment has a first thickness in a first thickness direction. The magnetic resonance system is configured to subsequently refocus a second three-dimensional volume segment, which likewise includes the predetermined region with a selective refocusing pulse. This second volume segment has a second thickness in a second thickness direction which is orthogonal to the first thickness direction. To read out the MR data, the magnetic resonance system is configured to repeatedly execute the following sub-steps: the magnetic resonance system switches a non-selective refocusing pulse, and the magnetic resonance system subsequently switches two phase coding gradients and an additional magnetic field gradient for spatial coding. The magnetic resonance system reads out the MR data (for example a k-space line) while the additional magnetic field gradient is switched.

The advantages of the magnetic resonance system according to the invention essentially correspond to the advantages of the method according to the invention that have been described in detail above.

The present invention also encompasses a non-transitory, computer-readable data storage medium encoded with programming instructions (control commands) that, when the storage medium is loaded into a computerized control and evaluation system of a magnetic resonance system, cause the control and evaluation system to operate the magnetic resonance system in accordance with one or more of the embodiments of the method described above.

The programming instructions can be source code (C++, for example) that must still be compiled and linked that must only be interpreted, or can be executable software code that need only to be loaded into the corresponding computer or control device for execution.

The electronically readable data medium can be a DVD, a magnetic tape or a USB stick, for example, on which the electronically readable control information is stored.

In contrast to older sequences—for example a TSE sequence ("Turbo Spin Echo") or an FSE sequence ("Fast Spin Echo")—the readout module of the pulse sequence according to the invention advantageously corresponds to a SPACE sequence ("Sampling Perfection with Application optimized Contrasts using different flip angle Evolutions"). In practice this SPACE sequence has been shown to be superior to the older TSE and FSE sequences due to the variable flip angles and the long echo train lengths that are possible from this, for example.

The present invention has the following advantages.

By avoiding aliasing effects, time-consuming steps to avoid these aliasing effects (oversampling, for example) can be avoided, whereby a marked reduction of the acquisition time results.

By an appropriate selection of the predetermined region, the present invention enables the targeted acquisition of a separate volume or of a defined part of a slice (without masking out the unwanted part of the volume or of the slice) in order to then create an MR image of specifically only this part. This has the advantage that a physician must also assess only this part of the volume or of the slice, which leads to a significant savings of working time.

The present invention is particularly suitable for acquiring MR data of a predetermined cuboid with predetermined dimensions in two directions. Naturally, the present invention is not limited to this preferred field of application since the present invention can, for example, also be used to acquire MR data of an arbitrary cuboid which has an arbitrary extent in all three spatial directions.

DESCRIPTION OF THE PREFERRED EMBODIMENTS

Figure 1:
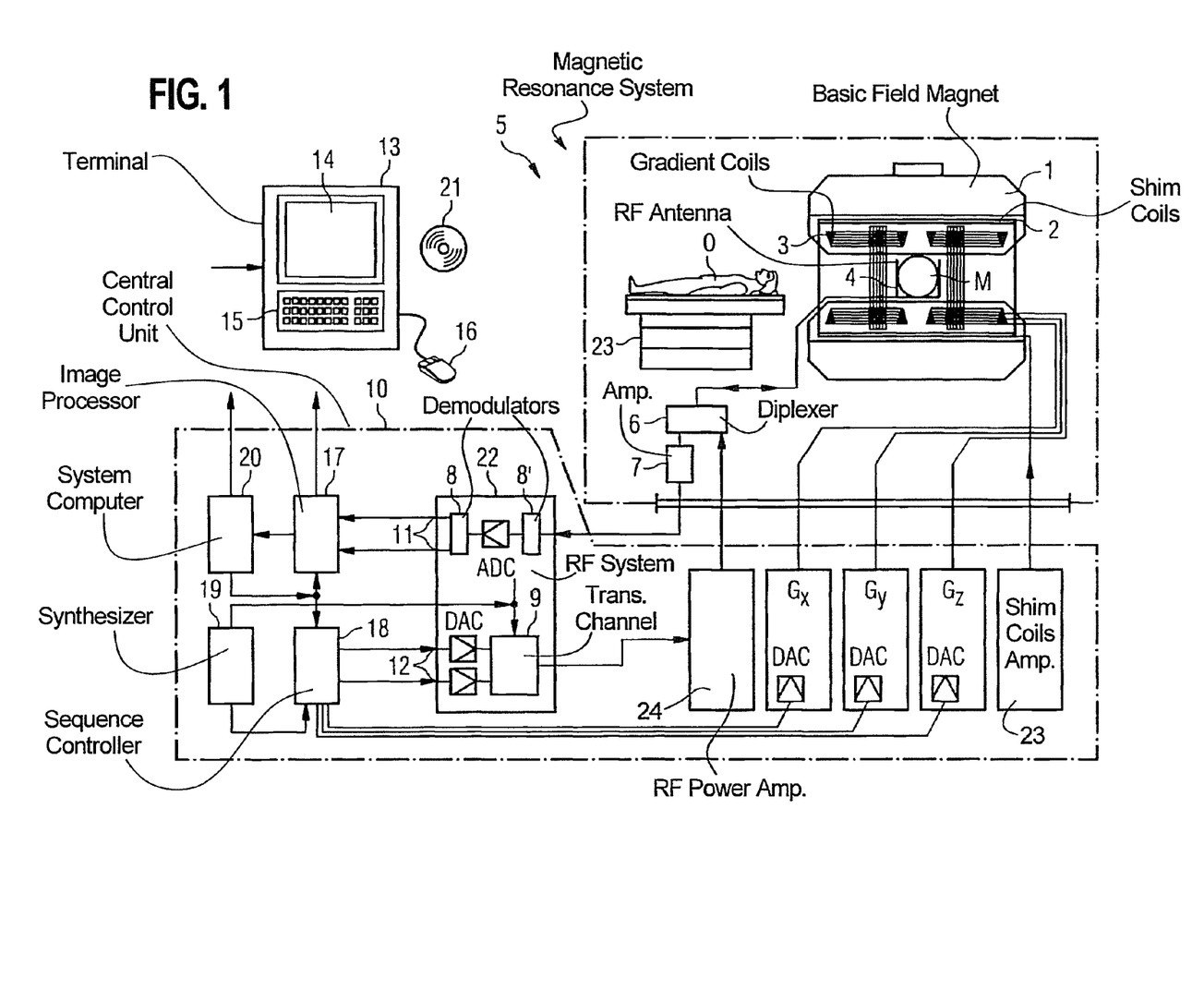
FIG. 1 shows a magnetic resonance system according to the invention.

FIG. 1 schematically shows a magnetic resonance system 5 (of a magnetic resonance imaging or magnetic resonance tomography apparatus). A basic field magnet 1 generates a temporally constant, strong magnetic field for polarization or alignment of the nuclear spins in a volume segment of a subject O (such as, for example, a part of a human body) that is to be examined that is examined while lying on a table 23 in the magnetic resonance system 5. The high homogeneity of the basic magnetic field that is required for the nuclear magnetic resonance measurement is defined in a typically spherical measurement volume M in which the parts of the human body that are to be examined are arranged. Shim plates made of ferromagnetic material are attached at a suitable location to assist in the homogeneity requirements, and in particular to eliminate temporally invariable influences. Temporally variable influences are eliminated by shim coils 2 operated by a shim coils amplifier 23.

A cylindrical gradient coil system 3 composed of three sub-windings is located in the basic field magnet 1. Each sub-winding is supplied by an amplifier with current to generate a linear (also temporally variable) gradient field in the respective direction of the Cartesian coordinate system. The first sub-winding of the gradient field system 3 thereby generates a gradient $G_x$ in the x-direction; the second sub-winding generates a gradient $G_y$ in the y-direction; and the third sub-winding generates a gradient $G_z$ in the z-direction. The amplifier includes a digital/analog converter controlled by a sequence controller 18 for time-accurate generation of gradient pulses.

Located within the gradient field system 3 are one (or more) radio-frequency antennas 4 that convert the radio-frequency pulses emitted by a radio-frequency power amplifier into an alternating magnetic field to excite the nuclei and align the nuclear spins of the subject O to be examined or, respectively, of the region of the subject O that is to be examined. Each radio-frequency antenna 4 has one or more RF transmission coils and one or more RF reception coils in the form of an annular (advantageously linear or matrix-like) arrangement of component coils. The magnetic field emanating from the precessing nuclear spins (normally the nuclear spin echo signals caused by a pulse sequence composed of one or more radio-frequency pulses and one or more gradient pulses) is also transduced by the RF reception coils into a voltage (measurement signal) that is supplied via an amplifier 7 to a radio-frequency acquisition channel 8 of a radio-frequency system 22. The radio-frequency system 22 furthermore has a transmission channel 9 in which the radio-frequency pulses are generated for the excitation of the nuclear magnetic resonance. The respective radio-frequency pulses are represented digitally in the sequence controller 19 as a series of complex numbers based on a pulse sequence predetermined by the system computer 20. This number series is supplied as real part and as imaginary part via respective inputs 12 to a digital/analog converter in the radio-frequency system 22, and from this to a transmission channel 9 and an RF power amplifier 24. In the transmission channel 9 the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate the radio-frequency pulses to excite the nuclear spins in the measurement volume M, and resulting echo signals are detected by the RF reception coil(s). The correspondingly acquired nuclear magnetic resonance signals are phase-sensitively demodulated at an intermediate frequency in the reception channel 8' (first demodulator) of the radio-frequency system 22 and are digitized in the analog/digital converter (ADC). This signal is further demodulated to a frequency of 0. The demodulation to a frequency of 0 and the separation into real part and imaginary part occurs in the digital domain in a second demodulator after the digitization. An MR image or three-dimensional image data set is reconstructed via an image computer 17 from the measurement data acquired in such a manner. The administration of the measurement data, the image data and the control programs takes place via the system computer 20. The sequence controller 18 monitors the generation of the respective desired pulse sequences and the corresponding scanning of k-space based on a specification with control programs. In particular, the sequence controller 18 thereby controls the time-accurate switching of the gradients, the emission of the radio-frequency pulses with defined phase amplitude, and the receipt of the nuclear magnetic resonance signals. The time basis for the radio-frequency system 22 and the sequence controller 18 is provided by a synthesizer 19. The selection of corresponding control programs to generate an MR image (the control programs being stored on a DVD 21, for example) and the presentation of the generated MR image take place via a terminal 13 which comprises a keyboard 15, a mouse 16 and a screen 14.

Figure 2:
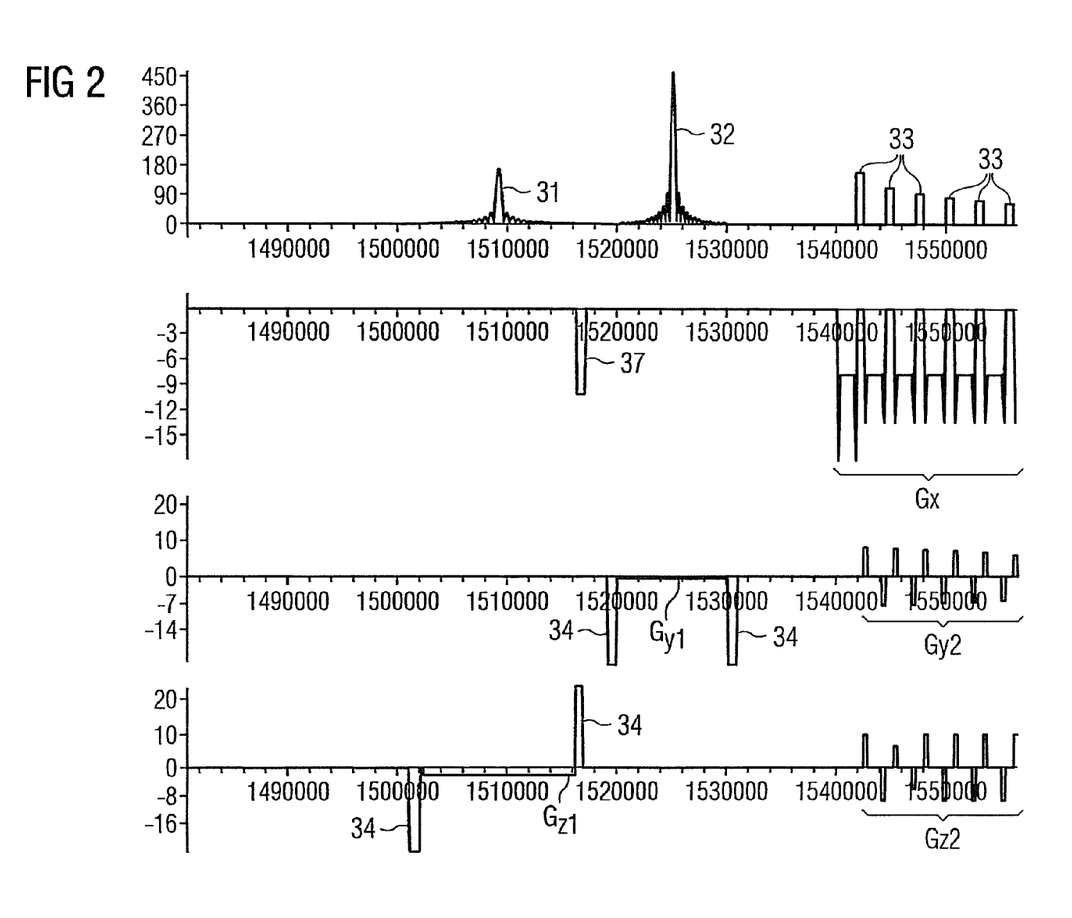
FIG. 2 shows a sequence according to the invention to acquire MR data within a cuboid.

A pulse sequence according to the invention is shown in FIG. 2. After a spoiler gradient 34 to destroy "old" magnetization, a selective RF excitation pulse 31 is switched together with a magnetic field gradient $G_{z1}$ in the direction of the z-axis in order to excite the spins within the first predetermined volume segment $V_1$ (see FIG. 3). The gradient pulse 37 switched in the direction of the x-axis serves to prepare the magnetization before the readout in that the magnetization is dephased before the following selective refocusing pulse 32.

The selective refocusing pulse 32 is subsequently switched together with a magnetic field gradient $G_{y1}$ in the direction of the y-axis (framed by two spoiler gradients 34), via which the spins in the second predetermined volume segment $V_2$ (see FIG. 3) are refocused. Since this refocusing essentially acts only at those spins which were previously excited by the RF excitation pulse 31, after the selective refocusing pulse 32 only spins in a cuboid Q (see FIG. 3) are refocused, which corresponds to the intersection set from the first volume segment $V_1$ and the second volume segment $V_2$. FID signals due to the refocusing pulse or refocuser 32 do not contribute to the signal in the later data acquisition since they were not appropriately prepared by the gradient pulses 37 or 34 before the refocuser 32 (see above), or are dephased by the spoiler 34 after the refocuser 32.

The MR data are subsequently read out in a defined k-space segment (wherein k-space corresponds with the cuboid Q) to read out a k-space line. A non-selective refocusing pulse 33 is switched following each of a gradient pulse $G_{y2}$ along the y-axis and a gradient pulse $G_{z2}$ along the z-axis. These two gradient pulses or phase coding gradients $G_{y2}$ and $G_z$ to serve for the phase coding. After these two phase coding gradients $G_{y2}$ and $G_{z2}$, a k-space line is read out, wherein a magnetic field gradient $G_x$ is switched in the direction of the x-axis.

After only a one-time switching of the selective RF excitation pulse 31 and the selective RF refocusing pulse 32, 120 or more non-selective refocusing pulses 33 (and therefore 120 or more k-space lines) can be read out if—as is described in the following in detail with FIGS. 5 and 6—the flip angle of the non-selective refocusing pulses 33 is varied accordingly.

The MR data or echo signals acquired with the aid of the first gradient $G_x$ are discarded, which is why no non-selective refocusing pulse 33 is also switched with these. (It is likewise possible that the MR data acquired with the aid of the first gradient $G_x$ are evaluated, i.e. are not discarded.)

Figure 3:
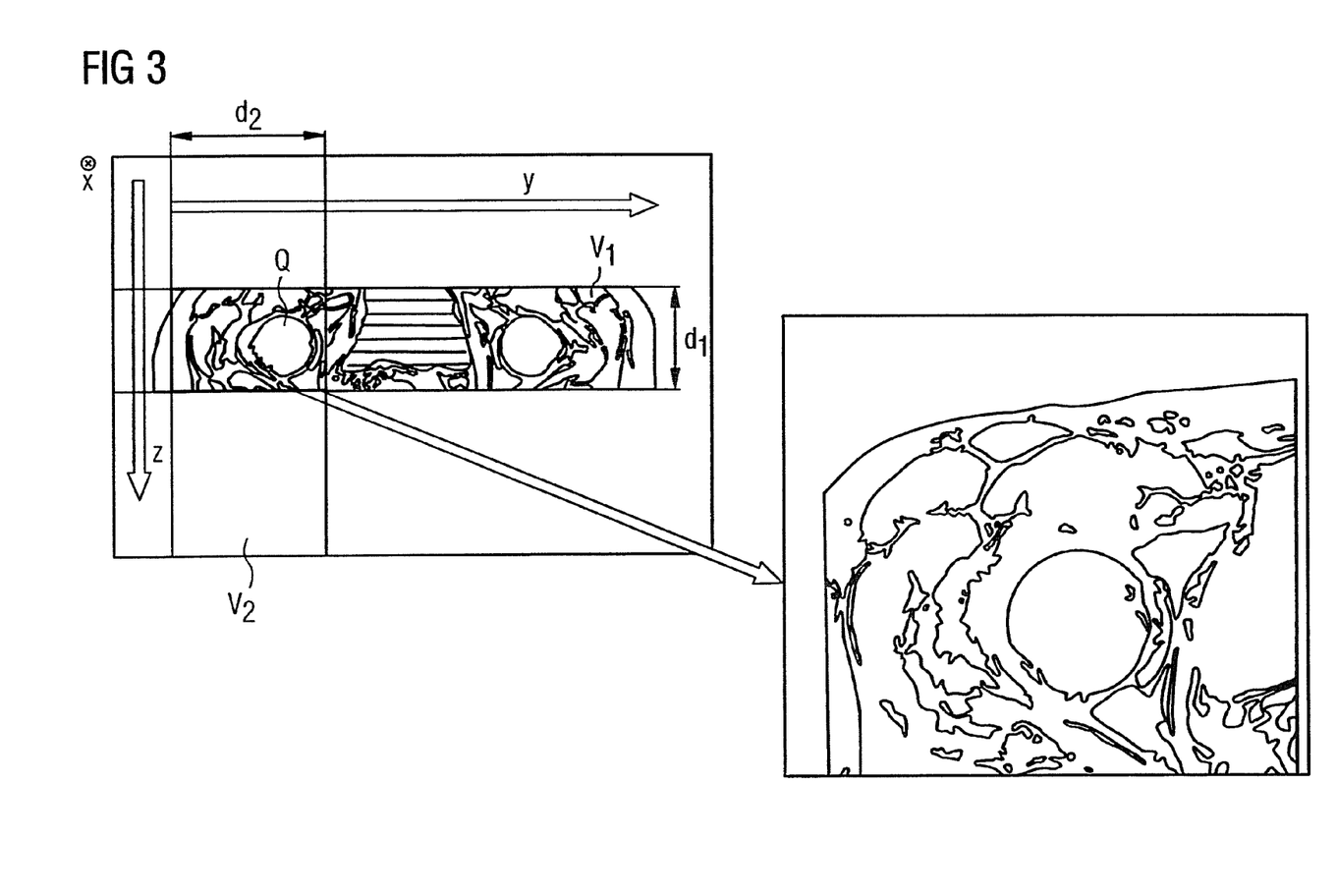
FIG. 3 shows as an example how the cuboid results from the intersection set of two three-dimensional volume segments.
Figure 4:
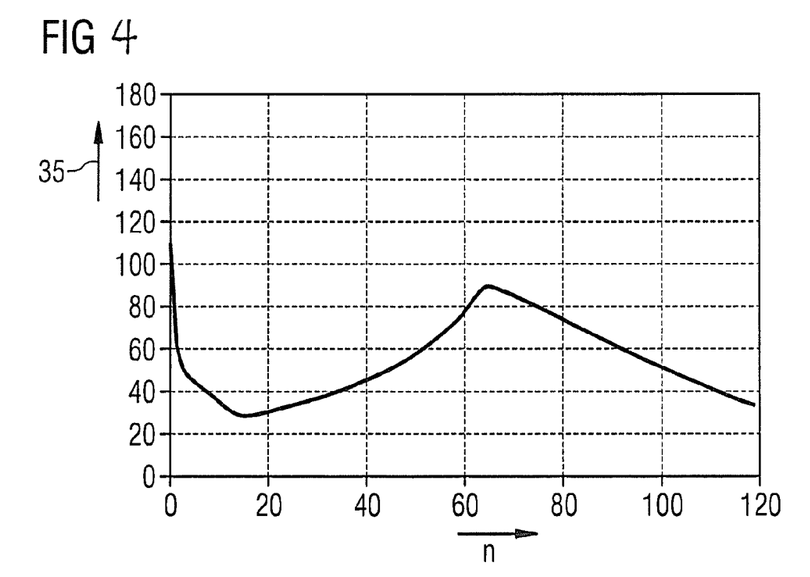
FIGS. 4 and 5 show how the average signal strength of the MR signal can be influenced via the variation of the flip angle.

The present invention is explained as an example with the use of FIGS. 3 and 4. The slice or the first volume segment $V_1$ with the slice thickness d1 is excited by means of the selective RF excitation pulse 31 (see FIG. 2). The slice or the second volume segment $V_2$ with the slice thickness d2 is subsequently refocused by means of the selective RF refocusing pulse 32 (see FIG. 2). Since only spins already excited with the RF excitation pulse 31 are refocused, only spins within the cuboid Q are refocused according to the invention. This cuboid Q results from the intersection set of the first volume segment $V_1$ and the second volume segment $V_2$ as it is shown in the left image in FIG. 3.

This intersection set is a cuboid with a large length in the direction of the x-axis. (This length is defined by the dimensions of the magnetic fields generated by the magnetic resonance system 5). In contrast to this, the cuboid Q has the thickness d2 in the direction of the y-axis and the thickness d1 in the direction of the z-axis. Since the RF excitation pulse 31 (together with the magnetic field gradient $G_{z1}$) is selective with regard to the z-axis and the selective refocusing pulse 32

(together with the magnetic field gradient $G_{y1}$) is selective with regard to the y-axis, the first volume segment $V_1$ essentially only has a limitation in the direction of the z-axis (the thickness d1) and has no limitation in the other two directions (x-direction and y-direction), while the second volume segment $V_2$ essentially has only a limitation in the direction of the y-axis (the thickness d2) and has no limitation in the two other directions (x-direction and z-direction).

Since, according to the invention, only spins within the cuboid Q which is limited in the direction of the two phase coding gradients $G_{y2}$ and $G_{z2}$ (or in the direction of the y-axis and the z-axis) are refocused, no aliasing artifacts advantageously occur in the direction of the phase coding gradients. The MR data can thereby be acquired either with a higher quality or more quickly in comparison to the prior art since the oversampling used according to the prior art is not required to avoid aliasing artifacts.

The present invention therefore enables that a qualitatively high-grade MR image of a predetermined region ("Inner Volume") or of a portion of a slice of an examination subject is generated as is shown in the right image in FIG. 3.

In comparison to the generation of the MR image shown at the left in FIG. 3, the generation of the MR image shown in the right of FIG. 3 requires a shorter acquisition time. Moreover, a physician or medical professional must also only assess the MR image that is presented to him. In other words, in the case of the MR image shown at the left in FIG. 3 the physician must assess both hip joints of the patient, while in the case of the MR image shown at the right in FIG. 4, the physician must evaluate only one hip joint.

The curve of the flip angle for the non-selective refocusing pulses 33 (see FIG. 2) is shown in FIG. 4. In FIG. 4, the index n of the respective non-selective refocusing pulse 33 is shown on the x-axis and the corresponding flip angles 35 for the corresponding refocusing pulse 33 is shown on the y-axis. For example, the first non-selective refocusing pule 33 (index 0) after the selective refocusing pulse 32 has a flip angle of approximately 105°, while the following non-selective refocusing pulses 33 have smaller flip angles 35. Approximately after the 15th non-selective refocusing pulse, the flip angles 35 rise again in order to then drop again approximately after the 65th non-selective refocusing pulse.

Figure 5:
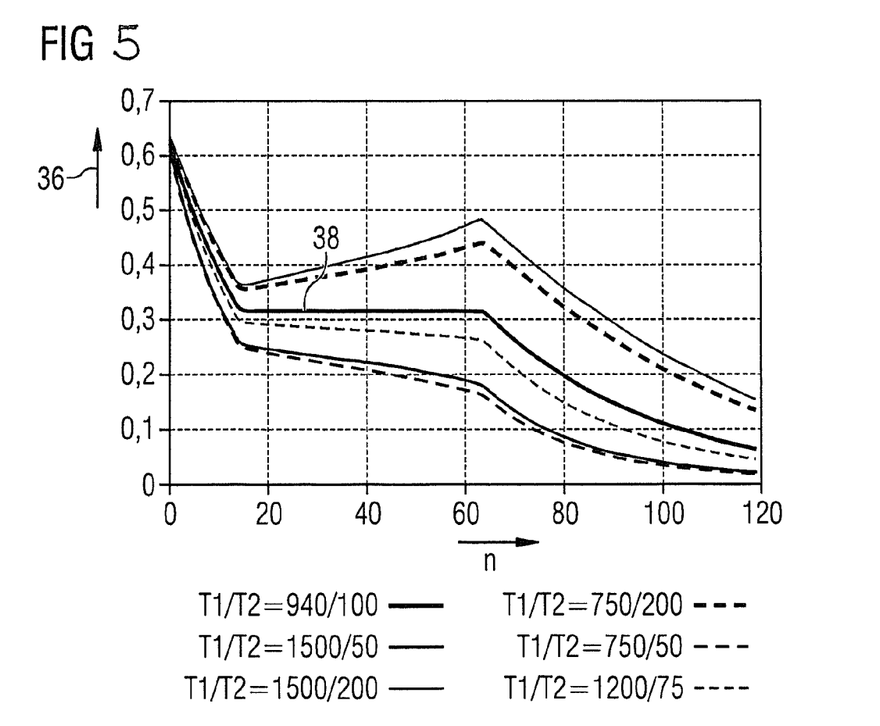

The average signal strength 36 of the MR signal or echo signal which is read out by the respective non-selective refocusing pulse after the refocusing is indicated in FIG. 5. The average signal strength thereby depends on the substance or material which is located in the excited or refocused region. The different substances for which the signal curves shown in FIG. 5 are applicable are thereby defined by the ratio of T1 (spin-grid relaxation time or, respectively, longitudinal relaxation time) to T2 (spin-spin relaxation time or, respectively, transversal relaxation time).

Of the shown signal curves, the signal curve 38 is preferred since this signal curve has a nearly invariant average signal strength for numerous refocusing pulses. While the average signal strength drops from the first non-selective refocusing pulse (index 0) up to approximately the 15th non-selective refocusing pulse, it then remains stable up to approximately the 65th non-selective refocusing pulse. Via a corresponding selection of the flip angle curve, the preferred signal curve 38 can also essentially be enabled for other substances within the region to be examined.

Figure 6:
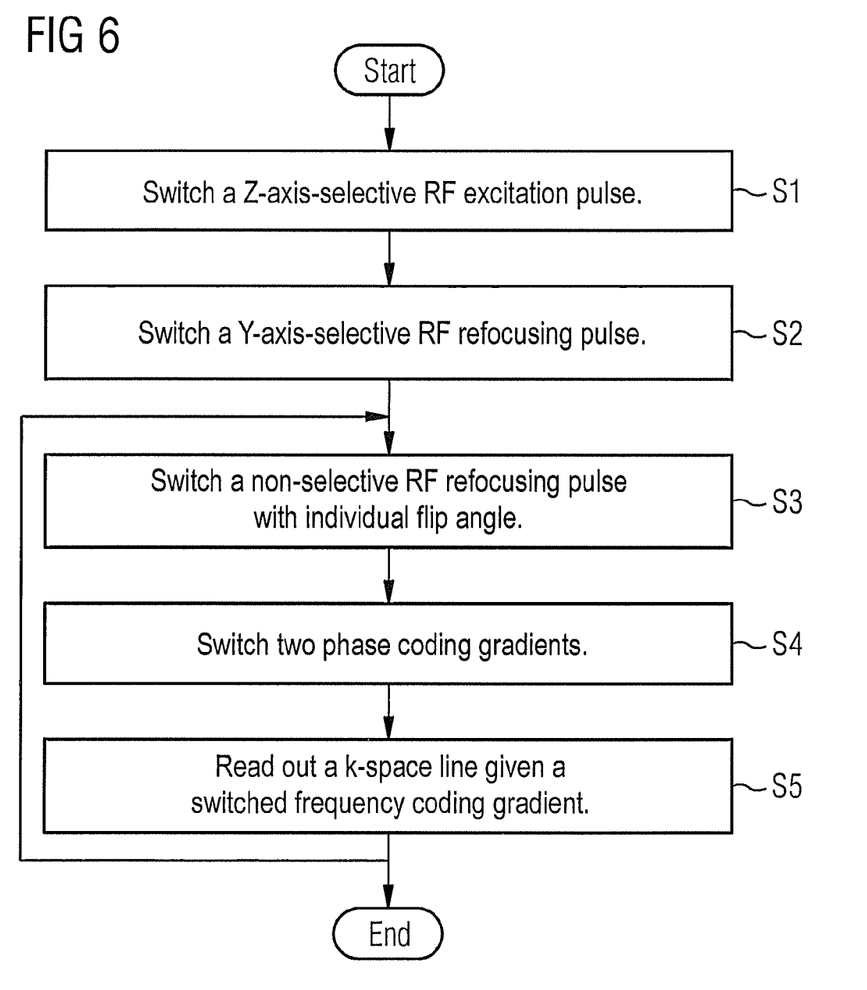
FIG. 6 is a flowchart of an embodiment of the method according to the invention.

A flowchart of a method according to the invention to acquire MR data is shown in FIG. 6.

In a first Step S1, an RF excitation pulse is switched which is selective in the direction of the z-axis. In a second Step S2, an RF refocusing pulse is switched which is selective in the direction of the y-axis.

In order to now read out MR data in the resulting cuboid, in a third Step S3 a non-selective RF refocusing pulse is switched with a flip angle that is individually selected for this refocusing pulse. Two phase coding gradients are subsequently switched in the fourth Step S4, and in the fifth Step S5 a k-space line is read out given a switched frequency coding gradient. The Steps S3 through S5 are repeated 120 times until the method returns to the first Step S1, and the Steps S1 through S5 are implemented until the entirety of k-space is acquired.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to acquire magnetic resonance (MR) data from a predetermined region within an examination subject, comprising:

from a computerized control unit, operating a MR data acquisition unit to selectively excite a first three-dimensional volume segment of an examination subject by radiating a radio-frequency (RF) excitation pulse, said first volume segment comprising a predetermined region and said first volume segment having a first thickness along a first thickness direction;

from said computerized control unit, operating said MR data acquisition unit to activate a selective refocusing pulse that selectively refocuses a second volume segment of the examination subject, said second volume segment also comprising said predetermined region, and said second volume segment having a second thickness along a second thickness direction that is orthogonal to said first thickness direction;

from said computerized control unit, repeatedly and in succession operating said MR data acquisition unit by activating a non-selective refocusing pulse, followed by activating two phase coding gradients and an additional magnetic field gradient for spatial coding of MR signals resulting from nuclear spins in said predetermined region excited by said RF excitation pulse, and reading out said MR signals while said additional magnetic field gradient is activated; and making said MR signals available in an MR data file from said computerized control unit.

2. A method as claimed in claim 1 comprising:

from said computerized control unit, operating said MR data acquisition unit to activate said phase coding gradients and said additional magnetic field gradient respectively orthogonally to each other in pairs, and with one of said phase coding gradients being directed along said first thickness direction.

3. A method as claimed in claim 1 comprising:

from said computerized control unit, operating said MR data acquisition unit to activate a first magnetic field gradient during said selected RF excitation pulse, and to activate a second magnetic field gradient during activation of said selective refocusing pulse, with said first magnetic field gradient and said second magnetic field gradient being orthogonal to each other.

4. A method as claimed in claim 1 comprising:

from said computerized control unit, radiating said selected RF excitation pulse with a configuration that excites nuclear spins in a cuboid forming said predetermined region, said cuboid having a thickness corresponding to said first thickness along said first thickness direction, and said cuboid having a further thickness corresponding to said second thickness along said second thickness direction.

5. A method as claimed in claim 1 comprising:
from said computerized control unit, operating said MR data acquisition unit to radiate the non-selective refocusing pulses with respective flip angles configured to produce a predetermined signal strength of said MR signals upon readout thereof, dependent on a known substance that occupies said predetermined region.

6. A method as claimed in claim 1 comprising:
from said computerized control unit, operating said MR data acquisition unit to activate at least one rephasing gradient before and after activating said selective refocusing pulse, with said at least one rephasing gradient being directed along said second thickness direction.

7. A method as claimed in claim 6 comprising:
from said computerized control unit, operating said MR data acquisition unit to also radiate at least one rephasing gradient directed along said first thickness direction.

8. A method as claimed in claim 6 comprising:
from said computerized control unit, operating said MR data acquisition unit to also radiate at least one rephasing gradient along a direction that is orthogonal to both said first thickness and said second thickness direction.

9. A method as claimed in claim 1 comprising:
from said computerized control unit, entering said MR signals into a k-space memory representing k-space, comprising a plurality of k-space segments; and
for each of said k-space segments, acquiring MR signals and entering the acquired MR signals into the respective k-space segment by operating said MR data acquisition unit from said computerized control unit to flip magnetization of nuclear spins in said predetermined region by +90° with said RF excitation pulse, and reading out first MR signals and entering said MR signals into the respective k-space segment, subsequently flipping said magnetization by −90° with said RF excitation pulse, and reading out second MR signals and entering said second MR signals into the respective k-space segment and, in said computerized control unit, averaging said first and second MR signals in the respective k-space segment in order to produce MR data for the respective k-space segment.

10. A magnetic resonance (MR) system comprising:
an MR data acquisition unit;
a computerized control unit;
said computerized control unit being configured to operate a MR data acquisition unit to selectively excite a first three-dimensional volume segment of an examination subject by radiating a radio-frequency (RF) excitation pulse, said first volume segment comprising a predetermined region and said first volume segment having a first thickness along a first thickness direction;
from said computerized control unit being configured to operate said MR data acquisition unit to activate a selective refocusing pulse that selectively refocuses a second volume segment of the examination subject, said second volume segment also comprising said predetermined region, and said second volume segment having a second thickness along a second thickness direction that is orthogonal to said first thickness direction;
from said computerized control unit being configured to repeatedly and in succession operate said MR data acquisition unit by activating a non-selective refocusing pulse, followed by activating two phase coding gradients and an additional magnetic field gradient for spatial coding of MR signals resulting from nuclear spins in said predetermined region excited by said RF excitation pulse, and reading out said MR signals while said additional magnetic field gradient is activated; and
said computerized control unit being configured to make said MR signals available in an MR data file from said computerized control unit.

11. A non-transitory, computer-readable data storage medium encoded with programming instructions that, when said data storage medium is loaded into a computerized control and evaluation system of an MR system that also comprises an MR data acquisition unit, cause said control and evaluation system to operate said MR data acquisition unit to:
selectively excite a first three-dimensional volume segment of an examination subject by radiating a radio-frequency (RF) excitation pulse, said first volume segment comprising a predetermined region and said first volume segment having a first thickness along a first thickness direction;
activate a selective refocusing pulse that selectively refocuses a second volume segment of the examination subject, said second volume segment also comprising said predetermined region, and said second volume segment having a second thickness along a second thickness direction that is orthogonal to said first thickness direction;
repeatedly and in succession activate a non-selective refocusing pulse, followed by activating two phase coding gradients and an additional magnetic field gradient for spatial coding of MR signals resulting from nuclear spins in said predetermined region excited by said RF excitation pulse, and read out said MR signals while said additional magnetic field gradient is activated; and
make said MR signals available in an MR data file.

* * * * *